United States Patent [19]

Thompson et al.

[11] Patent Number: 4,988,957

[45] Date of Patent: Jan. 29, 1991

[54] ELECTRONICALLY-TUNED THIN-FILM RESONATOR/FILTER CONTROLLED OSCILLATOR

[75] Inventors: Philip H. Thompson, Santa Rosa, Calif.; Stanley G. Burns, Ames; Robert J. Weber, Boone, both of Iowa

[73] Assignee: Iowa State University Research Foundation, Inc., Ames, Iowa

[21] Appl. No.: 358,624

[22] Filed: May 26, 1989

[51] Int. Cl.⁵ ............................................. H03B 5/32
[52] U.S. Cl. ................................. 331/107 A; 331/99; 331/107 SL; 331/158; 331/176; 331/177 V
[58] Field of Search ................... 331/158, 176, 177 V, 331/36 C, 116 R, 107 A, 99, 107 SL

[56] References Cited

U.S. PATENT DOCUMENTS

| | | | |
|---|---|---|---|
| 3,428,916 | 2/1969 | Hovenga et al. | 331/177 V X |
| 3,560,879 | 2/1971 | Fuchs | 331/177 V X |
| 4,816,778 | 3/1989 | Weber | 331/57 |

OTHER PUBLICATIONS

"UHF Oscillator Performance Using Thin Film Resonator Based Topologies", Burns et al., 41st Annual Freq. Contrl Symposium, 1987, pp. 382-387.

"Design and Performance of Oscillators Using Semiconductor Delay Lines", Burns et al., 1987 Ultrasonics Symposium, pp. 369-373.

"High Overtone Bulk Resonator Stabilized Microwave Sources", Moore et al., 1981 Ultrasonics Symposium, pp. 414-424.

Primary Examiner—Siegfried H. Grimm
Attorney, Agent, or Firm—Leydig, Voit & Mayer

[57] ABSTRACT

An electronically controlled oscillator capable of operating in the rf/microwave frequency range, and using a stacked crystal filter as the frequency determining element in the oscillator. A non-linear element including an appropriately biased high frequency amplifier has the stacked crystal filter connected in its feedback path and provides a loop gain of greater than 1 to meet one aspect of the Barkhausen criteria. An electronically variable impedance, such as a hyperabrupt junction varactor, is connected in the feedback loop along with the stacked crystal filter to controllably insert a phase adjustment into the feedback path, to be compensated by a phase adjustment by the stacked crystal filter, thereby to controllably maintain a loop phase shift which is an integral number of $2\pi$ radians at the oscillator frequency, and to vary the oscillator output frequency about the frequency of the stacked crystal filter in a controllable fashion. In a further implementation of the electronically controlled oscillator, an overmoded stacked crystal filter is utilized which has a comb response, and a second delay stacked crystal filter is also employed in the feedback path for providing an adjustable phase delay for causing the oscillator to controllably operate at the respective responses in the comb of responses of the overmoded stacked crystal filter.

16 Claims, 4 Drawing Sheets

ELECTRONICALLY-TUNED THIN-FILM RESONATOR/FILTER CONTROLLED OSCILLATOR

FIELD OF THE INVENTION

This invention relates to oscillators and more particularly to electronically controlled oscillators operating in the rf/microwave frequency range of several hundred MHz or more, and including operation into the GHz range.

BACKGROUND OF THE INVENTION

Thin film resonators (TFR's) have been and are currently being investigated as feedback elements in rf/microwave frequency oscillators. (See, for example, "UHF Oscillator Performance Using Thin Film Resonator Based Topologies", by Burns et al., 41st Annual Frequency Control Symposium—1987, pp. 382-387.) One form of thin film resonator is the overmoded stacked crystal filter (SCF) which has been investigated as the feedback element in an oscillator to produce an oscillator output in the form of a comb of frequencies normally associated with the overmoded stacked crystal filter itself. Such a device is described in "Design and Performance of Oscillators Using Semiconductor Delay Lines" by Burns et al., 1987 Ultrasonics Symposium, pp. 369-373. Insofar as applicants are aware, investigation of thin film resonators in oscillators, and particularly in stacked crystal filter oscillators, has not heretofore progressed to the stage where automatic electronic tuning of individual frequencies has been accomplished.

In other contexts, however, voltage control of oscillators has proven to be useful. Voltage control is accomplished by utilizing means such as a varactor in conjunction with an oscillator of the type normally considered tunable, with the varactor being the control element which serves to tune the oscillator to a frequency related to the voltage applied to the varactor.

Insofar as applicants are aware, and at least in large part because of the many complexities involved, the voltage control techniques have not been applied to thin film resonators particularly those of the stacked crystal filter variety.

SUMMARY OF THE INVENTION

In view of the foregoing, it is a general aim of the present invention, at least in one embodiment thereof, to provide an electronically controlled oscillator capable of operating at rf/microwave frequencies which is miniaturized, monolithically integratable, highly reliable and utilizes as the frequency selective element a stacked crystal filter (SCF) operating on a single fundamental or overtone mode.

In that regard, it is an object of the invention to utilize a stacked crystal filter in the feedback path of an oscillator, and to associate with such oscillator, electronic control elements for controllably tuning the loop which contains the stacked crystal filter to predetermined frequencies within the passband of the SCF.

In a particular aspect of the invention, it is a further object to provide a frequency agile electronically controlled oscillator which exploits the comb filter characteristics of an overmoded stacked crystal filter (or the characteristics of other forms of thin film resonator capable of producing a comb filter characteristic) to produce a frequency output readily tunable to the individual responses of the comb.

Accordingly, there is provided in accordance with the invention an electronically controlled oscillator comprising a non-linear element including an amplifier, a thin film stacked crystal filter, and an electronically variable impedance connected in a closed loop, the stacked crystal filter and the electronically variable impedance being connected in the feedback path of the amplifier. The amplifier provides a loop gain of at least one to meet one aspect of the Barkhausen criteria. The thin film stacked crystal filter has a resonant frequency in the rf/microwave frequency range, the range in which the oscillator is intended to operate. The electronically variable impedance is associated with the thin film stacked crystal filter in the amplifier feedback path for introducing an adjustment in the loop phase thereby to tune the frequency of the oscillator within the desired bandpass of the stacked crystal filter. Electronically variable means are coupled to the electronically variable impedance for establishing the impedance of the latter and thereby controllably adjusting the operating frequency of the oscillator.

The electronically variable impedance can be responsive to a number of characteristics and can comprise a voltage variable impedance for producing a VCO, a current variable impedance, or an impedance which is ultimately responsive to temperature to produce a TCXO. Preferably, however, the variable impedance is a voltage variable impedance such as a varactor and is connected in series in the feedback path for maintaining a filter Q which is independent of the tuning point of the oscillator.

In a further implementation of the invention, the frequency establishing element of the oscillator is in the form of a thin film resonator (preferably an overmoded stacked crystal filter) which produces a high Q comb of resonant frequencies at predetermined intervals. The feedback loop further includes a delay stacked crystal filter which operates in combination with an electronically variable impedance, as in the prior embodiment, to adjust total loop phase thereby to select individual responses among the comb of filter responses to serve as the oscillator output.

Other objects and advantages will become apparent from the following detailed description when taken in conjunction with the drawings, in which:

Figure 1:
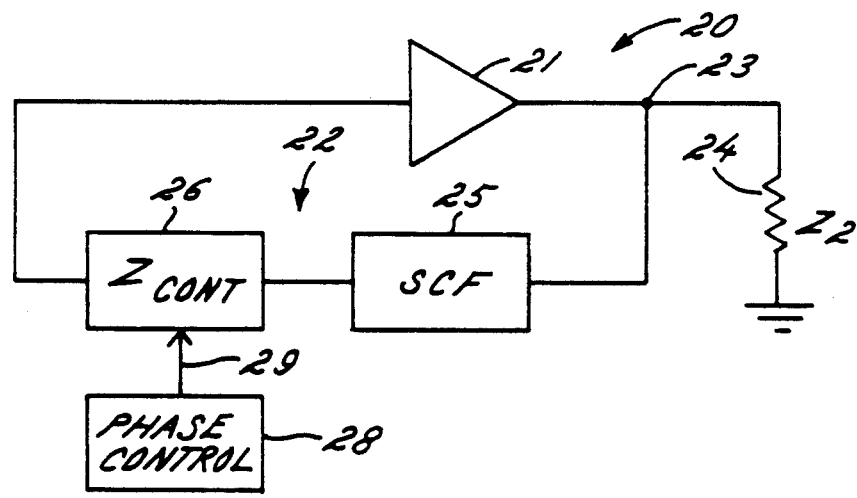
FIG. 1 is a block diagram illustrating a first embodiment of the present invention utilizing a stacked crystal filter in association with an electronically controlled impedance for controlling the output frequency of the oscillator.

While the invention will be describe connection with certain preferred embodiments, there is no intent to limit it to those embodiments. On the contrary, the intent is to cover all alternatives, modifications and equivalents included within the spirit and scope of the invention as defined by the appended claims.

DETAILED DESCRIPTION OF THE PREFERRED EMBODIMENTS

In the foregoing and also in the following, reference is made to rf/microwave frequencies at which the oscillator according to the present invention is operable. That band is intended to encompass the frequencies beginning at about 200 MHz and extending well into the GHz range. When utilizing the stacked crystal filter, GHz operation is particularly appropriate since the stacked crystal filter is capable of achieving high Q and low insertion loss characteristics at such operating frequencies due to the relatively thin and very controllable piezoelectric films which are deposited to form the resonators. However, certain advantages of the invention can be realized with thicker films in the hundreds of MHz range, and thus such range is encompassed within the broadest aspects of the present invention.

In the following, there will be two general forms (with several variations) of electronically controlled oscillators described which fall within the scope of the present invention. The first, using a single mode or primary mode thin film resonator, employs a particular form of thin film resonator, i.e., the stacked crystal filter, in order to obtain adequate Q and a well-behaved phase vs. frequency characteristic to yield a useful electronically controlled oscillator. A second form of oscillator uses an overmoded thin film resonator which produces a comb of frequency responses, and such overmoded filter while preferably constructed as a stacked crystal filter, can be configured in other forms of thin film resonator such as the monolithic resonator. In the second form, a stacked crystal filter is utilized in conjunction with the overmoded thin film resonator to provide a composite phase characteristic, and an electronically variable impedance is provided for tuning within that composite characteristic to select individual ones among the responses in the comb response of the overmoded thin film resonator. Since the overmoded thin film resonator can produce adequate Q even when not constructed as a stacked crystal filter, the frequency selective device in that embodiment can be implemented from a broader group of devices.

In both cases, voltage control is the preferred mode of electronic tuning, which is conveniently provided by use of a varactor as the tuning element. In addition, however, electronic tuning can be accomplished by current control such as a YIG (yttrium iron garnet) resonator which functions as a current controlled device to vary the impedance where a temperature compensated oscillator is desired, the control element (be it voltage or current responsive) is driven by a temperature responsive device, such as thermistor or sensistor which is configured, for example, to respond to the temperature to which the oscillator is subjected and to produce an electronic signal which adjusts the phase of the electronically controlled device to maintain the oscillator output frequency constant over a desired temperature range.

With that in mind, turning now to the drawings, FIG. 1 shows a first embodiment of the present invention utilizing a single mode of a stacked crystal filter as the frequency selective element in the feedback path of an amplifier which also includes an electronically controllable device for adjusting the output frequency of the oscillator. More particularly, in FIG. 1 there is shown an oscillator generally indicated at 20 which has a non-linear element including an amplifier 21 having a feedback path generally indicated at 22 providing a closed loop circuit having an output 23 driving a load 24 at a frequency determined by the oscillator 20. The amplifier 21 provides a system gain to meet one aspect of the Barkhausen criteria, that is, that the loop gain which includes the amplifier 21 and the elements in the feedback path 22 to be at least 1.

In practicing the invention, the feedback path 22 contains a thin film element, in the FIG. 1 embodiment, a thin film stacked crystal filter 25 for establishing the basic frequency and frequency range of the oscillator 20. More particularly, the stacked crystal 25 has a resonant frequency which is in the range at which the oscillator 20 is intended to operate. Typically, the resonant frequency of the stacked crystal filter 25 will be the primary resonant frequency, but as is well known to those skilled in this art, the filter element 25 can be modified to select other low but significant overtones for use as the primary filter bandpass characteristic.

Associated with the SCF 25 in the feedback path 22 is an electronically variable impedance 26 for adjusting the total loop phase to meet the second aspect of the Barkhausen criteria, i.e., that the total loop phase be zero degrees or $2\pi n$ radians, where n is an integer, at the operating frequency of the oscillator. Phase control means 28 are connected by means of control line 29 to the variable impedance 26 for adjusting the actual impedance thereof and thereby the phase of the feedback path 22. Thus, as the impedance of the element 26 is adjusted, the total loop phase would tend to change except that the stacked crystal filter 25 is driven to a different point in its phase characteristic thereby to tune the frequency of the loop and thereby the oscillator in a limited band about the resonant frequency of the stacked crystal filter 25.

In the preferred practice of the invention, the amplifier 21 is a commercially available high frequency amplifier having adequate gain to overcome the insertion loss of the elements in the feedback path 22 and a linear or relatively linear phase frequency characteristic to allow linear frequency tuning of the oscillator. Commercially available amplifiers can be provided having a typical 50 ohm output to allow the oscillator 20 to drive a standard load of 50 ohms represented by the load impedance 24. Use of a stacked crystal filter as the frequency selective device in such an arrangement is very desirable since the stacked crystal filter is easily configured to have a real impedance in a desired range such as a 50 ohm input or output impedance.

The stacked crystal filter 25 is a known thin film device having three metallic electrodes separated by two thin film piezoelectric resonator elements. In the preferred embodiment, the electrodes of the SCF 25 are aluminum and the piezoelectric films are A1N. All of the layers are grown on a substrate which can be relieved to suspend the operative portion of the resonator as a membrane. Typically, the aluminum electrodes are deposited by electron beam evaporation and the AlN piezoelectric films by sputtering. The configuration of the various layers of the SCF 25, and most particularly the thickness of the AlN piezoelectric films are carefully controlled, the thickness being maintained in the micron range, to provide the SCF 25 with a resonant frequency peaked in the desired range at which the oscillator 20 is intended to operate. As noted above, the manner in which the SCF 25 is configured will allow the selection of the primary or a low harmonic as the primary operating frequency of the SCF 25, and that selected mode will in turn establish the operating frequency of the oscillator 20. The insertion loss of the SCF 25 is also of concern, as is the Q of the device. If high Q is a desired characteristic, a number of individual SCF's can be connected in cascade, although increasing the number of SCF's in cascade will tend to increase the insertion loss. If minimum insertion loss is desired and a relatively lower Q can be tolerated, only a single SCF need be used as the frequency selective element.

In addition to having relatively high Q for selectivity (while still allowing tuning over the desired passband) and a tolerable insertion loss, the stacked crystal filter 25 desirably also possesses a well-behaved phase-frequency characteristic. Not all thin film resonators possess such a characteristic. For example, a conventional monolithic thin film resonator, in contrast to the desired linear frequency-phase characteristic, may have a number of minor but potentially significant perturbations in the phase frequency characteristic as illustrated in the diagram at page 385 of the aforementioned Burns et al. article. By way of contrast, a stacked crystal filter when used as the frequency selective element for the oscillator 20 can be configured with a more well-behaved phase characteristic, such that when coupled with an electronically controlled impedance having a linear characteristic, the oscillator 20 is provided with a linear control characteristic without points of non-linearity which might occur when using a monolithic thin film resonator in the circuit of FIG. 1.

In further practicing the invention, the feedback loop 22, in addition to the stacked crystal filter 25, includes an electronically controllable impedance 26 for adjusting the split of total loop phase among the loop elements, to select the point on the frequency phase characteristic of the stacked crystal filter 25 at which the oscillator 20 will oscillate. In the preferred embodiment, the electronically variable impedance 26 comprises a voltage controllable device, such as a varactor; when used with such a voltage controlled device, the oscillator 20 functions as a voltage controlled oscillator (VCO). VCO operation is achieved by adjusting the reverse bias voltage of the varactor utilized as electronically adjustable impedance 26. In a preferred implementation of the invention, a hyperabrupt junction varactor diode is used for the control element 26; such element exhibited a phase characteristic which varied in a relatively linear fashion from approximately 3 to approximately 9 volts bias with a bias center of approximately 6 volts. The oscillator was designed such that the center of the diode varactor tuning range was aligned with the center of the filter passband at about 1.033 GHz. The frequency tunability was determined to be about 0.335 MHz per volt for a phase slope of 9.75°/MHz for the filter and a phase-voltage slope of about 3.27°/volt for the series varactor diode. It is preferred to use a hyperabrupt junction varactor diode, as compared, for example, to an abrupt or linear graded junction varactor diode because the hyperabrupt device allows for the greatest variation in capacitance for a given bias voltage change.

The phase control 28 is not illustrated in detail since it is typically a conventional element depending upon the use for which the voltage controlled oscillator 20 is intended. For example, if the oscillator 20 is intended for use in a phase locked loop, the phase control 28 will include a phase detector which compares the oscillator operating frequency at the output 23 with the phase of an external oscillator to which the oscillator 20 is to be locked. The phase control 28 will produce a voltage signal on an output line 29 which controls the impedance of the element 26 (and thereby the phase of the SCF) to cause the phase produced by the oscillator 20 to match that of the external oscillator to which it is phase locked. Those familiar with other forms of oscillator control will appreciate other means of utilizing the voltage controlled oscillator of FIG. 1, such as the well-known frequency modulated oscillator in which the phase control 28 would produce a modulating signal on its output 29 for modulating the output of the oscillator 20.

In the voltage controlled embodiment (as well as in others), it is important to appropriately connect the electronically controllable impedance 26 in the feedback loop 22. In many types of oscillators used for voltage control, a varactor 26 is typically connected in parallel with the frequency determining elements of the loop for establishing the electronic control of frequency. However, in the oscillator 20, if the varactor 26 were connected in parallel with the stacked crystal filter 25, that would result in degradation of oscillator performance based on a change in the composite network feedback phase slope with operating frequency. In a simple resonator feedback circuit, the oscillator can be "pulled" by adding a capacitance in parallel with the SCF, but the Q related to the resonator phase slope is a rapid function of frequency and consequently noise performance will degrade. However, when the varactor diode represented by electronically adjustable impedance 26 is connected in series in the feedback path 22, the stacked crystal filter Q is not significantly affected by tuning of the controllable impedance 26, and the spectral purity of the VCO output as compared with prior fixed frequency SCF based oscillators is maintained. When connected in series, the varactor acts as a variable RC phase modulator having an amplitude response which remains substantially equal to unity over the entire range of controllable phase adjustment.

The illustration of controllable impedance 26 as a general block is intentional since, although voltage controlled operation by means of a series connected varactor is preferred, other forms of electronically variable impedance can also be employed. Among those form is a current controlled device such as that known commercial as YIG (yttrium iron garnet) resonator which can be used as a current controlled phase shift device when connected in the feedback path 22. In that configuration, the phase control device 28 would provide a current output on its output line 29 to control the YIG device positioned in the feedback path 22.

As a further important alternative, temperature controlled crystal oscillators (TXCO's) can be an important application of the present invention. In such devices, the electronically variable impedance 26 can be either current or voltage responsive, but the phase control element 28 itself is temperature responsive (for example, responsive to the ambient temperature to which the oscillator 20 is subjected) for operating on the phase of the controllable element 26 to maintain the oscillator output constant over the intended temperature operating range of the oscillator. In such an application, the phase control element 28 contains a thermistor or sensistor for measuring the ambient temperature and producing a signal which ultimately controls the electronically variable impedance 26 to maintain the output frequency of the oscillator 20 at its desired level. As an alternative, the varactor which might be used as the electronically adjustable impedance 26 can be replaced with a temperature variable capacitor for more direct control of the phase within the feedback loop 22 and the resulting operating frequency of the oscillator 20.

Figure 2:
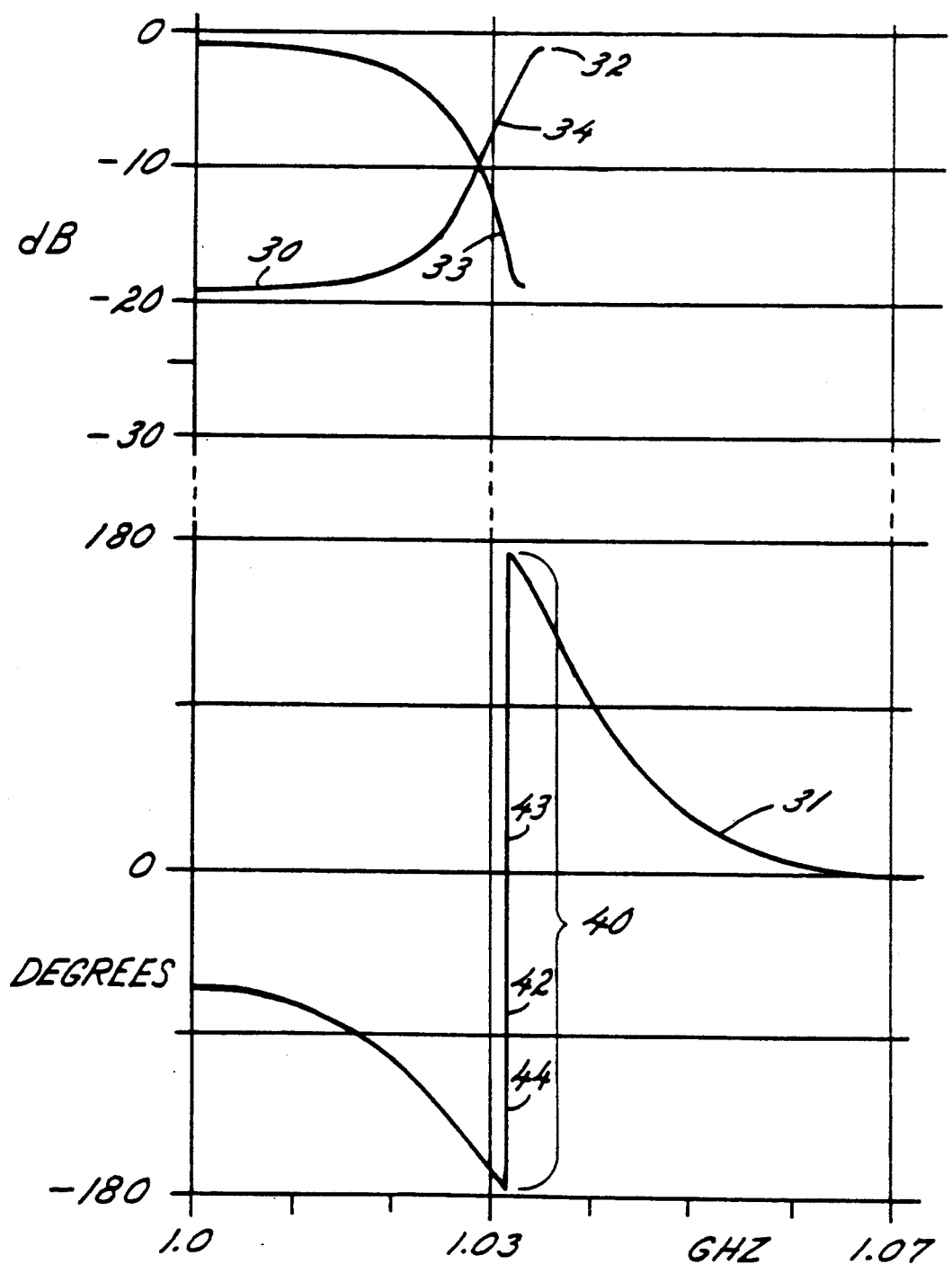
FIG. 2 is a diagram showing the amplitude and phase characteristics of the SCF used in the electronically controlled oscillator of FIG. 1.

The operation of the oscillator loop including the amplifier 21 and its feedback path 22, in tuning the output frequency of the oscillator will be better understood by reference to FIG. 2 which shows the amplitude transfer function and phase function of the stacked crystal filter 25 as a function of filter frequency. The upper plot of FIG. 2 shows a characteristic curve 30 representing the filter transfer function otherwise known as $S_{21}$, the S parameter of the filter which defines the forward transfer function as a function of frequency. It is seen that the function 30 has a sharp peak at point 32 at the resonant frequency of the SCF 25, in the illustrated embodiment at about 1.033 GHz. The relatively sharp skirts 33, 34 of the characteristic 30 illustrate that the Q of the filter is relatively high; in the illustrated embodiment the open loop Q of the SCF is about 80. It will thus be appreciated that the filter can exhibit a passband of at least about 5 MHz when tuned about its center frequency along the sharp but not overly peaked response characteristic at the point 32.

The lower plot 31 of FIG. 2 illustrates the phase characteristic with respect to frequency and it is seen that a substantially linear characteristic 40 is provided in the tuning range of the oscillator centered at about 1.033 GHz and having a passband of about 5 MHz controlled by the total loop phase which causes the SCF 25 to operate at a particular point along the linear portion of its characteristic 40. More particularly, if the total phase around the oscillator loop were such that the SCF were operating at the frequency established by operating point 42 along the characteristic 40, and if the phase control 28 were to produce a signal to cause the phase of electronically variable impedance 26 to decrease, in order to continue to satisfy the phase aspect of the Barkhausen criteria, the operating point of the SCF would shift to a second point 43. As a result, the operating frequency of the oscillator would accordingly shift to the frequency established by operating point 43, thereby electronically adjusting the oscillator operating frequency within the relatively narrow passband centered about 1.033 GHz center frequency of the SCF. Similarly, if the electronically adjustable impedance 26 were adjusted to increase the total loop phase, the operating point of the SCF would switch to a point 44 to maintain total loop phase equal to $2\pi n$ radians (where n is an integer), and cause a shift in the oscillator operating point to the frequency associated with operating point 44.

With the foregoing description in mind, those skilled in the art of oscillator and particularly microwave oscillator design will now be capable of implementing an oscillator according to the present invention for a desired frequency and frequency tuning range. Among the criteria to be used by such skilled artisans in configuring a particular implementation of the inventive oscillator, there will be utilized modeling of both the stacked crystal filter and the associated amplifier, preferably to produce S matrices which are manipulated to satisfy the Barkhausen criteria at the desired frequency operating point and tuning range.

Oscillator design requires measuring the S parameters of the SCF as a function of frequency in and near the desired passband, and converting these data to a Butterworth VanDyke equivalent circuit, derived from the Mason model. Since the SCF dimensions exhibit a large lateral dimension to thickness ratio, a one-dimensional plane wave analysis can be utilized. When operating at microwave frequencies, it is also important to include package parasitics in the model of the SCF. In certain cases, it is difficult to measure directly certain circuit parameters which depend strongly on k, the coupling coefficient, and Q. In those cases, model parameters can be obtained, as is well known to those skilled in this art, by ranging over k and Q value using microwave computerized analysis techniques available to those skilled in the art, such as the Touchstone circuit analysis and optimization routines, to provide a best fit of the model parameters to the measured data.

For the purpose of characterizing the commercially available hybrid broad band amplifier, such as a 2 GHz, 10 db gain, impedance matched unit utilized for an embodiment of the invention, a perturbational method of measuring large-signal, full-matrix, S-parameters can be used to characterize the amplifier operating at the compression level present in the closed loop configuration. The large-signal, S-parameters for the amplifier can then be combined with the linear S-parameters for the remainder of the oscillator circuit (including the SCF and electronically controllable impedance) and the net-two-port S-parameters can be computed using the aforementioned Touchstone trademark of EESOF computerized modeling techniques. Since it is known that the Barkhausen criteria requires a loop gain of at least 1 and a total loop phase of zero or $2\pi n$ radians where n is an integer, applying those criteria to the model derived from the foregoing analysis will predict the frequency at the onset of oscillation and the oscillation bandwidth. For use in such predictions, a further computerized technique widely used by those skilled in this art, and known as SPICE circuit simulation techniques, is utilized to determine the circuit conditions at which the Barkhausen criteria are satisfied.

For ease of fabrication and prototyping, the oscillator circuits of FIG. 1 can be constructed on microstrip and, to the extent available, commercially available devices such as the commercially available high frequency amplifier and varactor can be utilized. However, when it is desired to produce the device in higher quantities with maximum economics, when utilizing a stacked crystal filter in the feedback path it will be preferable to monolithically integrate all of the devices on a single semiconductor substrate. Such integration can be accomplished on silicon if the frequency requirements of the oscillator are such that silicon technology for the amplifier 21 is adequate, or if higher frequency is desired, and since SCF's have been constructed on GaAs and GaAs provides enhanced high frequency operation, the device in that case is preferably constructed on a monolithic GaAs substrate.

Figure 3:
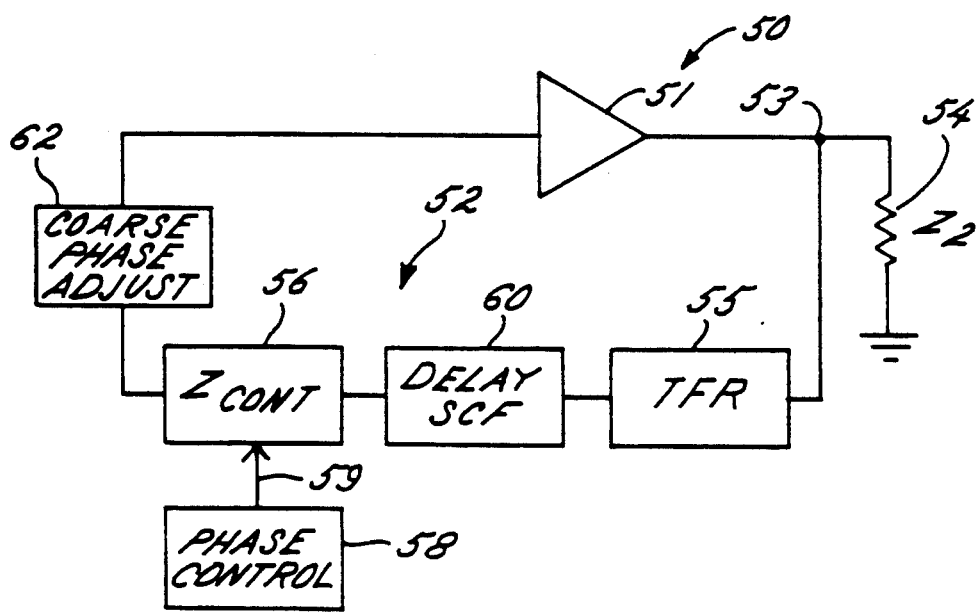
FIG. 3 is a block diagram illustrating an electronically controlled oscillator utilizing an overmoded stacked crystal filter in a feedback loop along with a voltage controlled impedance for selecting a particular one of the responses of the overmoded stacked crystal filter to be utilized as the oscillator output.

Turning now to FIG. 3, there is illustrated a further embodiment of the present invention which has particular application as a frequency agile oscillator. A frequency agile oscillator for purposes of this disclosure is considered to be one which can be rapidly tuned at spaced points in the frequency domain, the spacing between the points being significant as compared to the bandwidth of a single lobe of the oscillator frequency. For example, in an implementation of the present invention, a frequency agile oscillator has been configured having an operating frequency of about 1 GHz, and having discrete frequency shifts of about 4 MHz. Preferably, the oscillator provides the option of fine tuning about the operating points which are spaced at 4 MHz intervals. It will be apparent that the center frequency and the spacing between responses can be adjusted by appropriately configuring the frequency selective device in the frequency agile oscillator.

FIG. 3 shows the frequency agile oscillator 50 based on a non-linear element including an amplifier 51 and a feedback path 52 forming a closed oscillator loop. The oscillator has an output port 53 driving a load impedance illustrated at 54. Associated with the amplifier 51 is a feedback loop 52 which includes a frequency selective element 55. In the exemplary embodiment such frequency selective element is described generically as a thin film resonator. The thin film resonator in many instances is an overmoded stacked crystal filter, but can also be configured in certain embodiments as an alternate form of thin film resonator such a monolithic resonator. A common characteristic of all such thin film resonators used in this embodiment of the invention is the provision of an output response which has a high Q comb of frequency responses separated by predetermined frequency intervals. As in the FIG. 1 embodiment, however, the element 55 is the main frequency selective element of the oscillator 50 and establishes the center frequency of the oscillator output as well as the bandwidth of the oscillator, although the particular operating point in the bandwidth is controlled by other elements in the feedback loop. More particularly, as in the FIG. 1 embodiment, the feedback loop 52 includes an electronically controllable impedance $Z_{cont}56$ connected in the feedback path for introducing a controllable phase delay thereby to shift the operating phase point of the thin film resonator 55 and thereby the operating frequency of the oscillator 50. The controllable impedance 56, as in the prior embodiment, is preferably a hyperabrupt junction varactor diode, having a reverse bias applied by phase control circuitry 58 by means of interconnection 59 so that the phase control 58 is the direct mechanism for adjusting the split of the overall loop phase and thereby selecting the operating point of the thin film resonator 55 and thus the oscillator output frequency. As in the prior embodiment, alternatives for the elements 56, 58 are available in the form of current control devices or temperature responsive devices when such operation is desired of the oscillator 50.

In the frequency agile oscillator using a thin film resonator with a comb frequency output in order to stabilize the oscillator loop and allow ready selection between responses of the comb characteristic of the thin film resonator, a further stacked crystal filter in the form of delay SCF 60 is associated with thin film resonator 55 and connected in the feedback path 52 as illustrated. The delay SCF 60 has a center frequency which is very near that of the center frequency of the thin film resonator 55, and provides additional phase delay which allows individual selection from among the comb of responses of the thin film resonator (as will be described in greater detail below in connection with FIGS. 4 and 5). Suffice it to say for the moment that the combination of the thin film resonator 55 with its comb output and the additional delay introduced in the passband by the delay SCF 60 adjusts the phase of the comb responses one with respect to the other such that the controllable impedance 56 can select individual responses from the comb and cause the oscillator 50 to operate only at the selected response.

A further coarse phase adjustment element 62 is illustrated for the sake of completeness. In the microstrip implementation of the prototype of the FIG. 3 device, a relatively large additional phase delay is often required in order to satisfy the phase aspect of the Barkhausen criteria and the coarse phase adjust 62 in the form of a line stretcher is utilized so that the impedance introduced by the electronically adjustable impedance 56 is able to tune the combined characteristic of the thin film resonator 55 and delay SCF 60 in the desired output frequency operating range.

Figure 4:
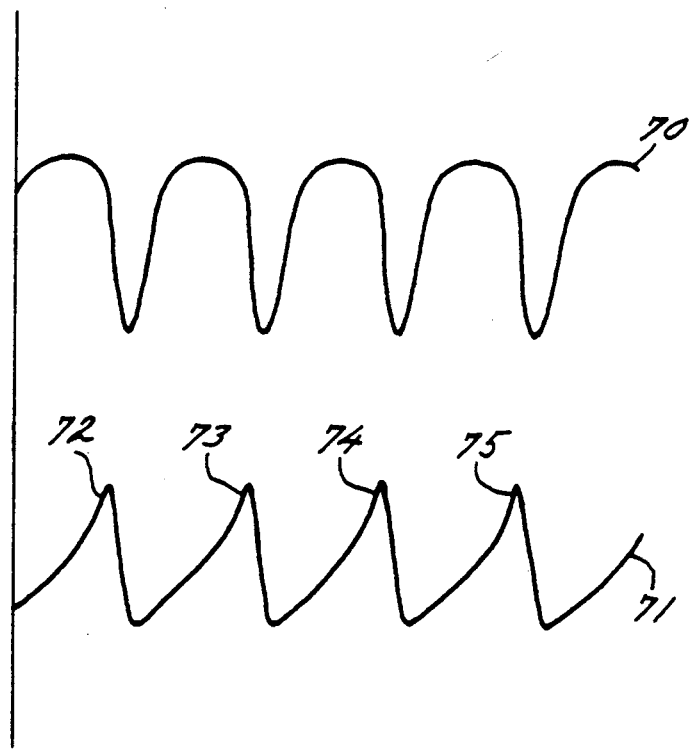
FIG. 4 is a diagram illustrating the amplitude and phase characteristics of the overmoded stacked crystal filter of the electronically controlled oscillator of FIG. 3.

Turning to FIG. 4, there is shown the phase and magnitude characteristics of an overmoded SCF for use as thin film resonator 55 in the oscillator 50 of FIG. 3. FIG. 4 includes an upper plot 70 which illustrates the phase of the overmoded SCF as a function of frequency, and lower plot 71 which illustrates the magnitude (the $S_{21}$ characteristic) as a similar function of frequency. It will be appreciated that the showing of FIG. 4 illustrates only a very small portion of the frequency spectrum of the overmoded stacked crystal filter since the spacing between peaks on the plots 70, 71 is about 4 MHz, although the center frequency for the plot is about 1 GHz.

The plots 70, 71 of the phase and magnitude characteristics, respectively of the overmoded stacked crystal filter, illustrate the comb-like nature of the overmoded oscillator (or also of other thin film oscillators capable of operating as overmoded devices, such as the monolithic resonator). The comb-like characteristic demonstrates a plurality of responses at frequencies associated with magnitude peaks 72-75. The "responses" of the overmoded filter referred to herein are intended to refer to operation of the filter at the magnitude peaks and in the linear portions of the phase characteristics at about the frequencies identified by the magnitude peaks 72-75. It will be appreciated from the sharpness of those peaks in FIG. 4 that the device is indeed high Q, an exemplary embodiment providing unloaded Q's on the order of 2,000.

Figure 5:
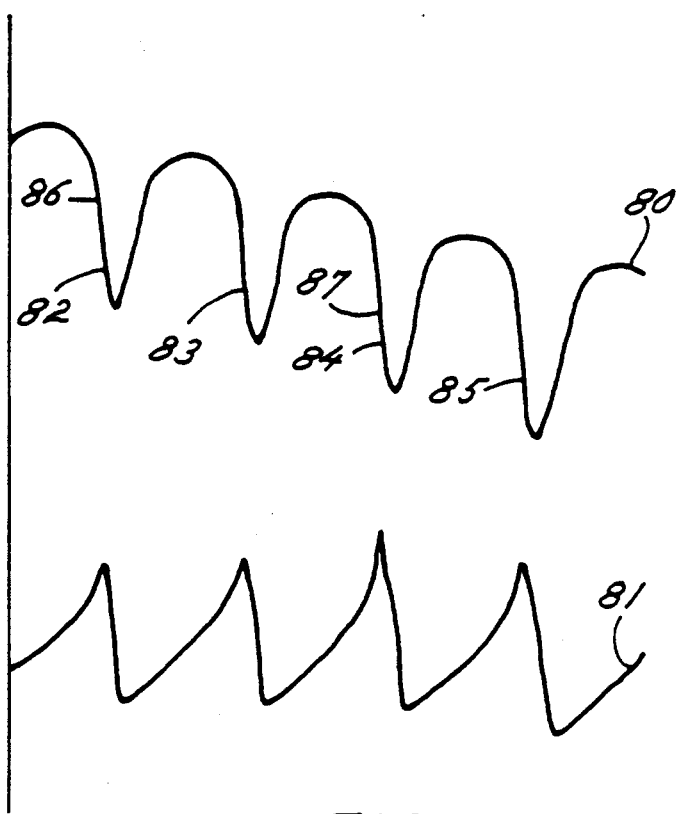
FIG. 5 is a diagram illustrating the amplitude and phase characteristics of the overmoded stacked crystal filter of FIG. 4 in tandem with a phase delay stacked crystal filter.

It will be appreciated from an examination of FIG. 4 that when overmoded stacked crystal filters were used in oscillators in the past, the output of such oscillators included the full comb characteristic of the frequency selective device, as described, for example, in the Burns et al. paper (see FIG. 5 at page 371). That will be appreciated, in part, because FIG. 4 demonstrates that even if selectivity were provided for such an oscillator, there is little opportunity to select between the various responses because the phase and magnitude characteristics are so similar.

In practicing an important aspect of the present invention in connection with frequency selective elements having comb-like output characteristics, means are provided for introducing additional selectivity among the responses of the comb-like characteristic, in combination with electronically adjustable selector means for individually selecting responses of the comb for driving the oscillator output at the selected response rather than the full comb of responses. To that end, the circuit of FIG. 3 provides the delay SCF which introduces additional phase delay into the feedback loop 52, the characteristics of which will be better appreciated by a comparison of FIGS. 5 and 4. FIG. 5 includes a pair of plots 80, 81 showing the phase and magnitude characteristics, respectively, of the overmoded stacked crystal filter of FIG. 4 in cascade with a delay stacked crystal filter 60 as illustrated in FIG. 3. It is particularly noted on the phase plot 80 that the responses 82–85, while they remain linear, are now displaced in phase one from the other so that the responses can be individually selected by control of the electronically adjustable impedance 56. Thus, the phase (illustrated on the vertical axis) associated with the major linear portion of the response 82 is at a different and therefore individually selectable phase than that of any of the other responses 83–85 and therefore can be individually selected. Thus, if the circuit of FIG. 3 is configured such that the electronically variable impedance 56 causes the thin film resonator 55 to operate at a particular frequency (point 86) on the response 82, a particular output frequency associated with the point 86 is selected. If the electronically controllable impedance 56 is then adjusted to decrease its phase by an amount suggested as the phase difference between the points 87, 86, by virtue of the sloped phase characteristic 80, the response 82 will be selected as the oscillator output and a particular point 87 along that response will determine the actual output frequency. Thus, a minor change in impedance of the electronically controllable impedance 56 caused by the phase control 58 will achieve a controllable but rather large shift in frequency (about 8 MHz in the illustrated embodiment), but the stability of the oscillator will retain its highly desirable crystal controlled characteristics.

Figure 6:
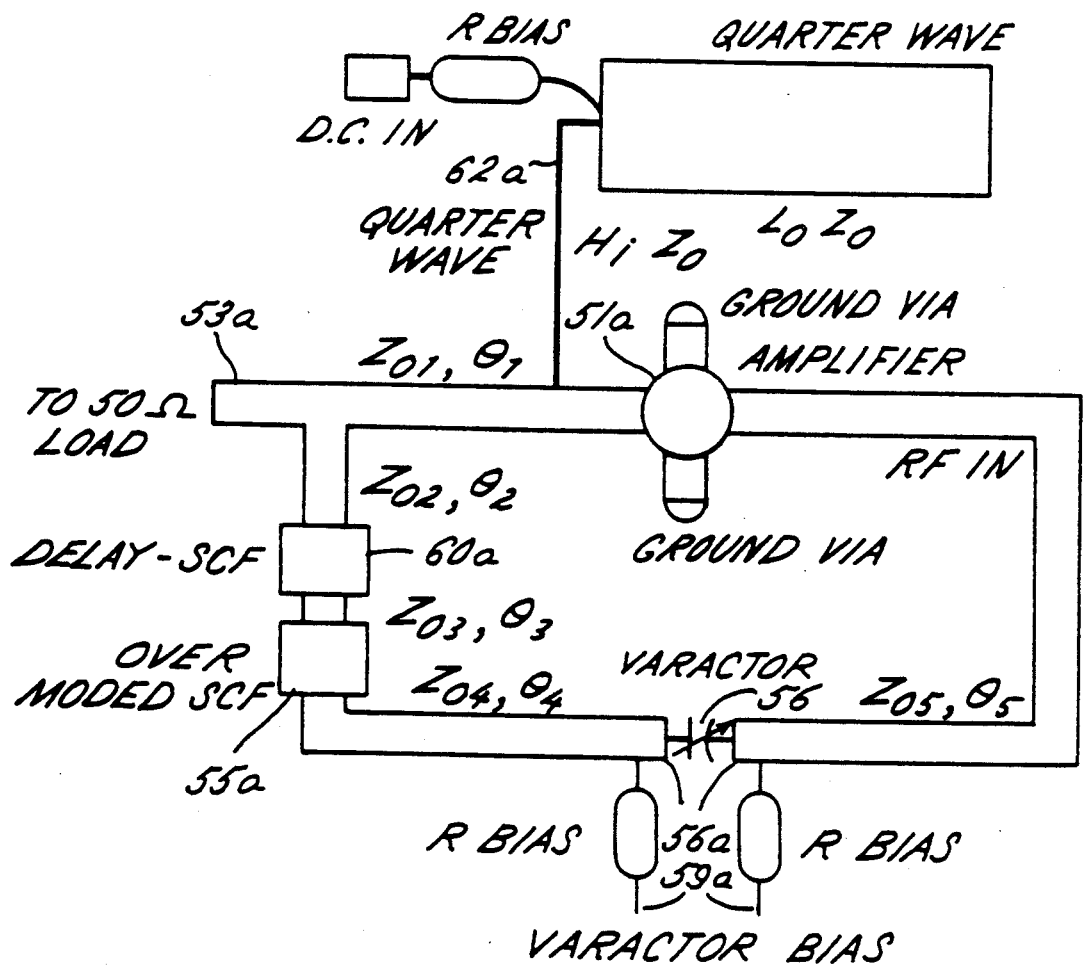
FIG. 6 is a diagram illustrating a microstrip implementation of the electronically controlled oscillator of FIG. 3.

It was noted above that production of small quantities of oscillators according to the invention, or prototype quantities, might be accomplished in microstrip whereas it was preferable, and the invention particularly lends itself, to production of large quantities of such devices in monolithically integrated form. For purposes of illustrating a particular configuration of the invention, FIG. 6 shows a prototype microstrip implementation corresponding to the circuit schematically illustrated in FIG. 3. A first portion 51a of the microstrip is provided for mounting of the amplifier 51 and includes appropriate vias and pads for making the connections. The overmoded SCF is shown fabricated at 55a and the delay SCF at 60a. The electronically variable impedance is illustrated as a varactor 56 which is adapted for connection at location 56a of the microstrip circuit implementation. Control lines 59a labelled varactor bias are intended to serve as the means for applying a reverse bias to the varactor for controlling the impedance thereof and thereby the operating phase of the overmoded SCF. The coarse phase adjust 62 (FIG. 3) is illustrated as microstrip section 62a having a particular size and shape adapted to produce the appropriate phase adjustment to allow the other phase elements to achieve the Barkhausen criteria of zero loop phase shift at the desired operating point. The strip line section 53a serves as the output terminal for connection to an external load 54 (FIG. 3). The length and thickness of the various microstrip connections between the devices are illustrated as being associated with particular impedances $Z_o, \phi$ (related to line length) for matching output and input impedances of the various devices in the microstrip application.

While a monolithically integrated circuit is not illustrated in the drawings, it will now be apparent to those skilled in this art that it is not only preferable in high volume production to monolithically integrate such devices, but that standard monolithic integration techniques are clearly adaptable according to the teachings of the present invention to produce an electronically controllable oscillator as described and claimed herein.

It will now be apparent that what has been provided is an electronically controllably oscillator having at least two primary embodiments and numerous variations thereon. In one embodiment, a stacked crystal filter is utilized as the frequency determining element in an oscillator loop which also includes an electronically adjustable impedance, the loop elements serving to satisfy the Barkhausen phase criteria while phase is adjusted by the electronically variable element to shift the operating point of the stacked crystal filter along its linear range to provide VCO or other electronically controllable tuning. In a second implementation, a thin film resonator, preferably a stacked crystal filter, having an overmoded characteristic thereby to produce a rich high Q comb of responses, is utilized in a feedback path which includes not only an electronically adjustable impedance, but also a second delay stacked crystal filter to allow individual selection of responses within the comb for operation of the oscillator, and rapid tuning of the oscillator between responses by simple adjustment of the loop phase introduced by the electronically controllable impedance.

We claim:

1. An electronically controlled oscillator comprising, in combination:

a non-linear element including an amplifier connected in a loop providing a loop gain of at least one at frequencies at which the oscillator is intended to oscillate, a thin film stacked crystal filter having a resonant frequency in the rf/microwave frequency range and connected in the feedback path of the amplifier, the resonant frequency of the stacked crystal filter being in the range at which the oscillator is intended to oscillate, the stacked crystal filter having a phase-frequency characteristic with a substantially linear portion over a narrow frequency range, an electronically variable impedance associated with the thin film stacked crystal filter in the feedback path of the amplifier for adjusting the loop phase thereby to cause the loop to oscillate in said narrow frequency range in which the phase-frequency characteristic of the stacked crystal filter is substantially linear, and electronically variable means coupled to the electronically variable impedance for controlling the impedance thereof and thereby causing the operating point of the stacked crystal filter to be controllably adjusted along the substantially linear portion of the phase-frequency characteristic to controllably adjust the operating frequency of the oscillator.

2. The combination as set forth in claim 1 wherein the electronically variable impedance is a voltage variable impedance, and wherein the electronically variable means produces a bias voltage having a variable level for establishing the impedance of the voltage variable impedance and thereby the operating frequency of the oscillator.

3. The combination as set forth in claim 2 wherein the voltage variable impedance comprises a hyperabrupt junction varactor connected in series in the feedback path of the amplifier thereby to avoid significant degradation of the loaded Q of the stacked crystal filter.

4. The combination as set forth in claim 1 wherein the electronically variable impedance is a current variable impedance, and wherein the electronically variable means produces a current having a variable level for establishing the impedance of the current variable impedance and thereby the operating frequency of the oscillator.

5. The combination as set forth in claim 1 wherein the electronically variable means and the electronically variable impedance comprise temperature responsive means for controlling the operating frequency of the oscillator thereby to produce a TCXO.

6. The combination as set forth in claim 1 wherein the stacked crystal filter is an overmoded stacked crystal filter having a comb of high Q resonant responses at predetermined frequency intervals and further comprising:
- a phase delay stacked crystal filter in the feedback path of the amplifier associated with the overmoded stacked crystal filter,
- the phase delay stacked crystal filter, the overmode stacked crystal filter and the electronically variable impedance being connected in the feedback path to produce a loop phase delay which causes the oscillator to oscillate at the frequency associated with a selected one of the resonant responses of the comb of responses of the overmoded stacked crystal filter,
- the electronically variable means serving to adjust the loop phase delay thereby to selectively choose among the responses in the comb of responses of the overmoded stacked crystal filter.

7. The combination as set forth in claim 6 wherein the electronically variable impedance is a voltage variable impedance, and wherein the electronically variable means produces a bias voltage having a variable level for establishing the impedance of the voltage variable impedance and thereby the response in the comb of responses at which the oscillator will oscillate.

8. The combination as set forth in claim 7 wherein the voltage variable impedance comprises a hyperabrupt junction varactor connected in series in the feedback path of the amplifier thereby to avoid significant degradation of the loaded Q of the overmoded stacked crystal filter.

9. A frequency agile voltage controlled oscillator comprising, in combination:
- a non-linear element including an amplifier connected in a loop providing a loop gain of at least one at frequencies at which the oscillator is intended to oscillate,
- a thin film resonator having a comb of high Q frequency responses at predetermined frequency intervals, the thin film resonator being connected in the feedback path of the amplifier,
- a phase delay stacked crystal filter connected in the feedback path of the amplifier and associated with the thin film resonator, the phase delay stacked crystal filter being connected to alter the phase of the responses of the thin film resonator when connected in said loop,
- an electronically variable impedance also connected in the feedback path of the amplifier for introducing a phase adjustment into said loop to be compensated by a phase adjustment in the thin film resonator to select an individual one among the responses in the comb of responses, and
- electronically variable means coupled to the electronically variable impedance for establishing the impedance thereof to controllably adjust the loop phase thereby to controllably select individual ones of the responses of the thin film resonator as the oscillator operating frequency.

10. The combination as set forth in claim 9 in which the electronically variable impedance comprises a hyperabrupt junction varactor.

11. The combination as set forth in claim 10 in which the hyperabrupt junction varactor is connected in series in the feedback path thereby to avoid significant degradation of the loaded Q of the thin film resonator.

12. The combination as set forth in claim 9 in which the electronically variable means and the electronically variable impedance comprise temperature responsive means for controlling the operating frequency of the oscillator thereby to cause said oscillator to operate as a TCXO.

13. The combination as set forth in -claim 9 in which the thin film resonator comprises an overmoded stacked crystal filter.

14. The combination as set forth in claim 13 in which the electronically variable impedance comprises a hyperabrupt junction varactor.

15. The combination as set forth in claim 14 in which the hyperabrupt junction varactor is connected in series in the feedback path thereby to avoid significant degradation of the loaded Q of the thin film resonator.

16. The combination as set forth in claim 13 further including an adjustable phase delay in the feedback path of the amplifier associated with the phase delay stacked crystal filter and the overmoded stacked crystal filter for adjusting the phase delay in the feedback path to provide a phase delay which is an integral number of $2\pi$ radians at the selected oscillator frequency thereby to cause the oscillator to oscillate at said frequency.

* * * * *